United States Patent
Furuie et al.

(10) Patent No.: US 7,474,046 B2
(45) Date of Patent: Jan. 6, 2009

(54) DISPLAY PANEL

(75) Inventors: Masamitsu Furuie, Mobara (JP);
Hironori Toyoda, Mobara (JP);
Masaaki Okunaka, Fujisawa (JP)

(73) Assignee: Hitachi Displays, Ltd., Chiba (JP)

( * ) Notice: Subject to any disclaimer, the term of this patent is extended or adjusted under 35 U.S.C. 154(b) by 458 days.

(21) Appl. No.: 11/287,402

(22) Filed: Nov. 28, 2005

(65) Prior Publication Data
US 2006/0114176 A1 Jun. 1, 2006

(30) Foreign Application Priority Data
Nov. 30, 2004 (JP) ............................. 2004-346303

(51) Int. Cl.
*H01L 51/50* (2006.01)
*H05B 33/00* (2006.01)

(52) U.S. Cl. .................. 313/500; 313/503; 313/504; 313/505; 257/E51.001

(58) Field of Classification Search ......... 313/498–512; 315/169.1, 169.3; 428/690–691, 917; 438/26–29, 438/34, 82; 257/40, 72, 98–100, 642–643, 257/759; 427/58, 64, 66, 532–535, 539; 445/24–25
See application file for complete search history.

(56) References Cited

FOREIGN PATENT DOCUMENTS

| JP | 10-222086 | 2/1997 |
|---|---|---|
| JP | 222086/1998 | 2/1997 |

*Primary Examiner*—Mariceli Santiago
*Assistant Examiner*—Donald L Raleigh
(74) *Attorney, Agent, or Firm*—Reed Smith LLP; Stanley P. Fisher, Esq.; Juan Carlos A. Marquez, Esq.

(57) ABSTRACT

The present invention provides a display device which can suppress mura or irregularities of brightness of a display. To be more specific, in a display device including the plurality of pixels which are arranged in a matrix array and are respectively provided with light emitting layers, a power source is supplied to the respective light emitting layers of the respective pixels which are arranged in parallel in one direction among the respective pixels through a common power source signal line, wherein the respective pixels allow the light emitting layers thereof to have different thicknesses from each other in a state that the thickness of the light emitting layer at an upstream side of a flow of an electric current along the power source signal line is larger than the thickness of the light emitting layer at a downstream side of the flow of the electric current along the power source signal line.

15 Claims, 9 Drawing Sheets

DISPLAY PANEL

CROSS-REFERENCE TO RELATED APPLICATIONS

The disclosure of Japanese Patent Application No. JP2004-346303 filed on 2004 Nov. 30 including the claims, the specification, the drawings and the abstract is incorporated herein by reference in its entirety.

BACKGROUND OF THE INVENTION

1. Field of the Invention

The present invention relates to a display device, and for example, an organic EL display device.

2. Description of the Related Art

For example, an active-matrix-type organic EL display device is configured such that pixels each of which is provided with a light emitting layer made of an organic EL layer are arranged in a matrix array.

Further, a row of pixels which are formed of the respective pixels arranged in parallel in the x direction, for example, are formed using a gate signal line in common, and the row of pixels are sequentially selected by sequentially supplying signals (scanning signals) to the respective gate signal lines.

Further, a column of pixels which is formed of pixels arranged in parallel in the y direction is formed using a data signal line and a power source supply line in common, wherein in conformity with the selection timing of the above-mentioned respective pixel rows, data is supplied to the respective pixels of the row of pixels from the data signal line and a power source is supplied to the light emitting layers of the respective pixels through the power source supply lines corresponding to the supply of the data.

The display devices having such a constitution are disclosed in JP-A-2004-102245 (US Family includes US2004-041753A1) (patent document 1), JP-A-2004-102246 (US Family includes US2004-041753A1) (patent document 2), JP-A-2003-330387 (US Family includes US6762564B2) (patent document 3), JP-A-2003-123988 (US Family cannot be identified) (patent document 4), JP-A-2002-32037 (U.S. Pat. No. 6,714,178B2) (patent document 5), JP-A-11-40362 (US Family cannot be identified) (patent document 6), for example.

Further, there have been following descriptions besides the above-mentioned constitution in these respective patent documents.

That is, in the patent document 1 to the patent document 3, there exists the description that a width of wiring is increased. In patent document 4, there exists the description that auxiliary lines are arranged in parallel to each other. In patent document 5, there exists the description that a plurality of power source supply portions is arranged. In patent document 6, there exists the description that a thick film of an organic EL layer which is used as a planar light source is adjusted.

SUMMARY OF THE INVENTION

However, with respect to the display devices having such constitutions, along with the large-sizing of a display panel, there arises a situation in which mura (irregularities) of brightness which is generated on a display screen cannot be ignored.

As a result of a search for seeking a cause of the brightness irregularities, it has been found out that a power source supply line is formed with a relatively small width and hence, a voltage drop is generated in a power source supplied to the power source supply line whereby a voltage applied to a pixel on a power source supply side and a voltage applied to a pixel remote from the power source supply side differ from each other.

As a method for overcoming such a drawback, it may be possible to adopt a countermeasure such as the changing of the width of the power source supply line. However, there arises a drawback that it is impossible to prevent the lowering of a numerical aperture.

Further, tasks to overcome these drawbacks are not disclosed in the above-mentioned patent documents.

The present invention has been made under such circumstances and it is an object of the present invention to provide a display device which can suppress the brightness irregularities of a display.

Further, it is another object of the present invention to provide a display device which can suppress the lowering of a numerical aperture.

Among the inventions disclosed in this specification, to briefly explain the summary of typical inventions, they are as follows.

(1) First embodiment of a display device according to the present invention includes a plurality of pixels which are arranged in a matrix array and are respectively provided with light emitting layers, wherein among the respective pixels, a power source is supplied to the respective light emitting layers of the respective pixels which are arranged in parallel in one direction through a common power source signal line, wherein the respective pixels allow the light emitting layers thereof to have different thicknesses from each other in a state that the thickness of the light emitting layer arranged at an upstream side of a flow of an electric current along the power source signal line is set larger than the thickness of the light emitting layer at a downstream side of the flow of the electric current along the power source signal line.

(2) Second embodiment of a display device according to the present invention is characterized in that the light emitting layers of the respective pixels which use the power source signal line in common have the thicknesses thereof decreased as the pixels come closer to the downstream side of the flow of the electric current along the power source signal line.

(3) Third embodiment of a display device according to the present invention is characterized in that the respective pixels which use the power source signal line in common are divided into a plurality of groups along the power source signal line, the thicknesses of the light emitting layers are made different from each other for every group, and the thicknesses of the light emitting layers are decreased as the pixels come closer to a downstream side of an electric current along the power source signal line.

(4) Fourth embodiment of a display device according to the present invention is characterized in that the light emitting layer is constituted as a stacked body formed of the light emitting layer and at least a hole transport layer, and the difference in thickness of the light emitting layers is brought about by the hole transport layer.

(5) Fifth embodiment of a display device according to the present invention includes a plurality of pixels which are arranged in a matrix array and are respectively provided with light emitting layers, wherein in the respective pixels, the light emitting layers of the respective pixels which are arranged in parallel in one direction emit light of any one of red, green and blue and, at the same time, the light emitting layers of the respective pixels which are arranged close to the respective pixels in the direction which intersects one direction emit lights of remaining respective colors, and a power source is supplied to the respective light emitting layers of the respective pixels which are arranged in parallel in one direction through a common power source signal line, wherein the respective pixels along the power source signal line have the light emitting layers which differ in thickness from each other, and the thicknesses of the light emitting layers at an upstream side of a flow of an electric current along the power source signal line is set larger than thicknesses of the light emitting layers at a downstream side of the flow of the electric current along the power source signal line, and a gradient of a change of the thickness of at least the green light emitting layer is set smaller than corresponding gradients of the light emitting layers of other colors.

(6) Sixth embodiment of a display device according to the present invention includes a plurality of pixels which are arranged in a matrix array and are respectively provided with light emitting layers, wherein in the respective pixels, the light emitting layers of the respective pixels which are arranged in parallel in one direction emit light of any one of red, green and blue and, at the same time, the light emitting layers of the respective pixels which are arranged close to the respective pixels in the direction which intersects one direction emit light of remaining respective colors, and a power source is supplied to the respective light emitting layers of the respective pixels which are arranged in parallel in one direction through a common power source signal line, wherein the respective pixels along the power source signal line have the light emitting layers which differ in thickness from each other, and the thicknesses of the light emitting layers at an upstream side of a flow of an electric current along the power source signal line is set larger than thicknesses of the light emitting layers at a downstream side of the flow of the electric current along the power source signal line, and a gradient of a change of the thickness of at least the red light emitting layer is set larger than the corresponding gradients of the light emitting layers of other colors.

(7) Seventh embodiment of a display device according to the present invention is on the premise of either one of the fifth embodiment and sixth one, characterized in that the light emitting layers of the respective pixels which use the power source signal line in common have the thicknesses thereof decreased as the pixels come closer to the downstream side of the flow of the electric current along the power source signal line.

(8) Eighth embodiment of a display device according to the present invention is on the premise of either one of the fifth embodiment and sixth, characterized in that the respective pixels which use the power source signal line in common are divided into a plurality of groups along the power source signal lines, the thicknesses of the light emitting layers are made different from each other for every group, and the thicknesses of the light emitting layers are decreased as the pixels come closer to the downstream side of the electric current along the power source signal line.

(9) Ninth embodiment of a display device according to the present invention is on the premise of either one of the fifth embodiment and sixth one, characterized in that the light emitting layer is constituted as a stacked body formed of the light emitting layer and at least a hole transport layer, and the difference in thickness of the light emitting layers is brought about by the hole transport layer.

(10) Tenth embodiment of a display device according to the present invention is on the premise of any one of between the first embodiment and the ninth one, characterized in that the display device includes a power source common line to which one ends of the respective power source signal lines are connected in common outside a display part which is formed of a mass of the respective pixels, and the power sources are supplied from one end of the power source common line, and the thicknesses of the light emitting layers of the respective pixels are changed in the direction from one corner of the display part arranged close to a power source side of the power source common line to another corner of the display part which faces one corner.

(11) First embodiment of a manufacturing method of a display device according to the present invention is characterized in that in forming light emitting layers in respective pixel regions formed on a surface of a substrate in a matrix array by vapor deposition by way of a mask, the vapor deposition is performed by moving a vapor deposition shielding plate which faces a vapor deposition surface of the substrate in an opposed manner and is moved in one direction thus changing thicknesses of the light emitting layers.

(12) Second embodiment of a manufacturing method of a display device according to the present invention is characterized in that in forming light emitting layers in respective pixel regions formed on a surface of a substrate in a matrix array by vapor deposition by way of a mask, the vapor deposition is performed by allowing a vapor deposition source to face the surface of the substrate in an opposed manner and to move from one side of the substrate to another side of the substrate which faces one side in an opposed manner and, at the same time, the thicknesses of the light emitting layers are changed by changing a speed of the vapor deposition source.

Here, the present invention is not limited to the above-mentioned constitutions and various modifications are conceivable without departing from the technical concept of the present invention.

According to the display device having such constitutions, it is possible to suppress the mura of brightness or the brightness irregularities of the display.

Further, it is possible to suppress the lowering of the numerical aperture.

BRIEF DESCRIPTION OF DRAWINGS

FIG. 2A and FIG. 2B are views showing one embodiment of the display device according to the present invention, wherein FIG. 2A is a plan view and FIG. 2B is a cross-sectional view;

DETAILED DESCRIPTION OF THE INVENTION

Hereinafter, a display device according to the present invention is explained by taking, for example, an organic EL display device as an example in conjunction with drawings.

Figure 2A:
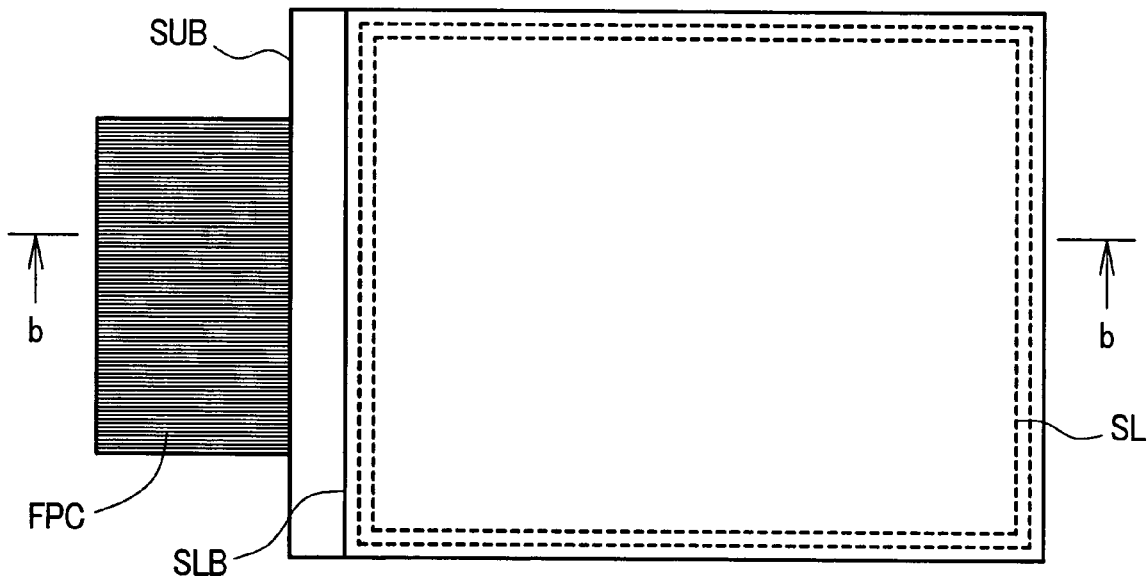
Figure 2B:
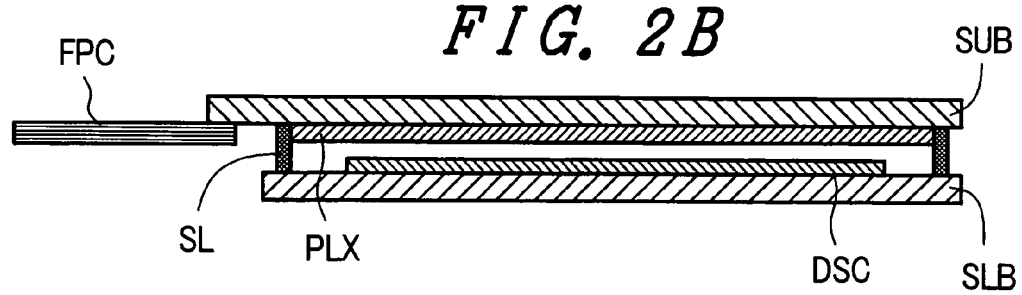

FIG. 2A is a plan view showing one embodiment of the whole constitution of the organic EL display device according to the present invention, and FIG. 2B is a cross-sectional view taking along a line b-b in FIG. 2A.

The display device includes a rectangular transparent substrate SUB. On a back surface of the transparent substrate SUB, pixel forming portions PIX which are constituted of a large number of pixels which are arranged in a matrix array and circuits and the like which drive the pixels are formed. These pixel forming portions PIX are formed by stacking a metal layer, a semiconductor layer, an insulation layer and a light emitting layers or the like which are patterned by selective etching using a photolithography technique.

On a surface on which these pixel forming portions PIX are formed, to form an inert atmosphere, a sealing substrate SLB is arranged to face the surface in an opposed manner by way of a sealing material SL, wherein a desiccant DSC is mounted on a surface of the sealing substrate SLB which faces the pixel forming portions PIX by coating.

Further, on the surface of the transparent substrate SUB on which the pixel forming portions PIX are formed, respective signal lines which are served for supplying signals to the respective pixels are pulled out to one side of a periphery of the transparent substrate SUB after getting over the sealing material SL and, thereafter, the respective signal lines have pulled-out portions thereof connected to a flexible printed circuit board FPC.

Emitted lights from light emitting layers (not shown in the drawing) of the respective pixels in the pixel forming portions PIX are recognized as an image after passing through the transparent substrate SUB.

Figure 3:
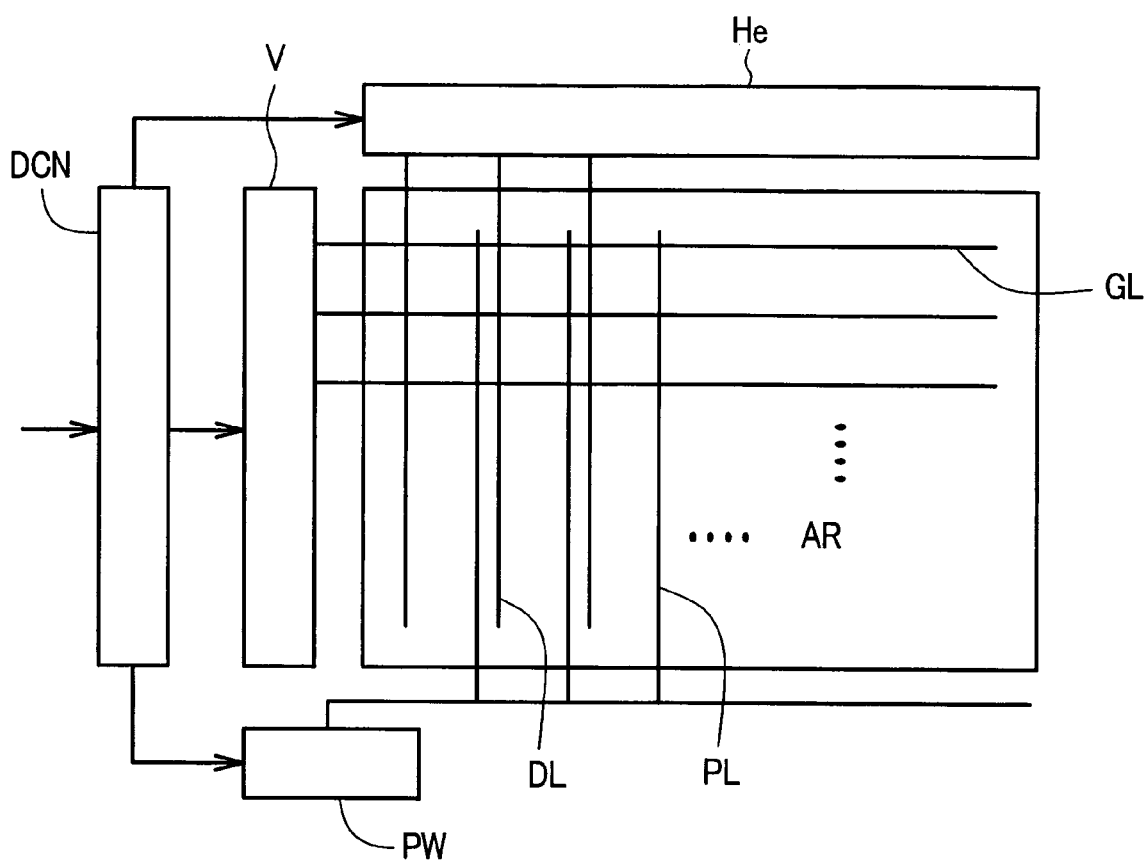
FIG. 3 is a block diagram showing the summary of a drive circuit of the display device according to the present invention.

FIG. 3 is a schematic view showing one embodiment of the respective pixels in the pixel forming portions PIX formed on the surface of the transparent substrate SUB and circuits which drive these respective pixels.

A mass of the respective pixels is constituted as a display part AR and signals are supplied to the respective pixels from a scanning signal drive circuit V, a data signal drive circuit He and a light emitting power source part PW which are arranged outside the display part AR through respective signal lines. Further, the display device also includes a display control part DCN and the scanning signal drive circuit V, data signal drive circuit He and the light emitting power source part PW are controlled by the display control part DCN.

Among the respective pixels which are arranged in a matrix array, the respective pixels which are arranged in parallel in the row direction use a signal line (scanning signal line) GL from the scanning signal drive circuit V in common, while the respective pixels which are arranged in parallel in the column direction use a signal line (data signal line) DL from the data signal drive circuit He and a signal line (power source signal line) from the light emitting power source part PW in common.

Here, for example, on the surface of the transparent substrate SUB, the display part AR, the scanning signal drive circuit V and the data signal drive circuit He are formed, while the display control part DCN and the light emitting power source part PW are formed as externally mounted parts with respect to the transparent substrate SUB. However, such an arrangement is arbitrary and it is needless to say that the scanning signal drive circuit V and the data signal drive circuit He, for example, may be formed as externally mounted parts with respect to the transparent substrate SUB.

Figure 4:
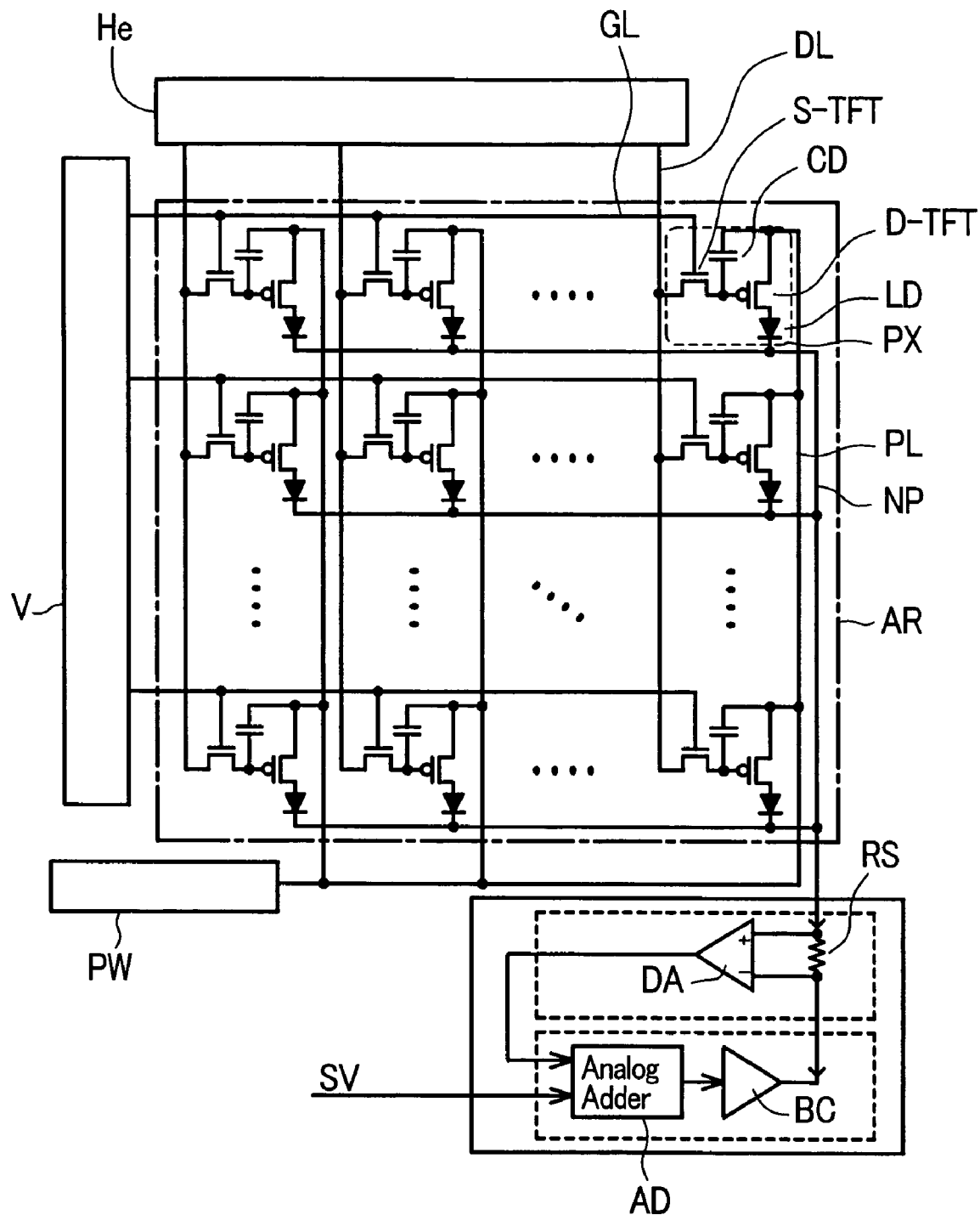
FIG. 4 is an equivalent circuit diagram showing the drive circuit of the display device according to the present invention including a circuit in the inside of a pixel.

FIG. 4 is a view which shows the constitution of the display part AR in FIG. 3 in more detail and also is a view which shows an equivalent circuit in each pixel.

Each pixel PX is formed in a state that the pixel PX is surrounded by the gate signal lines GL which are connected to the respective pixels in the row direction in common, the data signal line DL and the power source signal line PL which are connected to the respective pixels in the column direction in common.

Each pixel PX includes a switching element S-TFT which is driven in response to the supply of the scanning signal from the gate signal line GL in a region thereof, and a video signal from the data signal line DL is fetched to the inside of the pixel PX due to the driving of the switching element S-TFT.

The video signal is supplied to one end of a capacitive element CD which has another end thereof connected to the power source signal line PL and, at the same time, is supplied to a gate electrode of the drive element D-TFT.

The drive element D-TFT constitutes a serial connection body together with the light emitting element LD, and the serial connection body is connected to the above-mentioned power source signal line PL on the drive element D-TFT side and is connected to a cathode NP which is used in common by the respective pixels on the light emitting element LD side.

The above-mentioned capacitive element CD functions as a capacitive element for storing data. When a charge stored in the capacitive element CD becomes a given quantity or more, the drive element D-TFT is driven, an electric current from anode PP side flows in a cathode NP through the drive element D-TFT and the light emitting element EL whereby the light is emitted from the light emitting element (light emitting layer) EL.

The respective power source signal lines PL have one-end sides thereof connected in common using a power source common line PPL, and the light emitting power source part PW is connected to a one-end side of the power source common line PPL. Due to such a constitution, the power source (ground side) from the light emitting power source part PW is supplied to the respective power source signal lines PL through the power source common line PPL.

Here, in FIG. 4, in a region outside the display part AR, there is provided a circuit which takes out an electric current from the above-mentioned cathode NP, detects information about the average brightness (analogue voltage) of the display part AR by detecting a voltage drop when the electric current flows in the resistance RS using a differential amplifier DA, adds the information about the average brightness to the reference potential SV using an analogue adder circuit AD, and returns the electric current to the above-mentioned cathode NP through the buffer circuit BC. This circuit is a circuit which adjusts the brightness to given brightness over the whole image of the display part AR by changing a reference potential SV.

However, this circuit is not always necessary in the application of the present invention.

Further, although the above-mentioned circuit of each pixel includes the switching element S-TFT and the drive element D-TFT, for example, the present invention is also applicable to a circuit which includes other transistors for performing the correction of signals or the like besides these transistors, for example.

Figure 5:
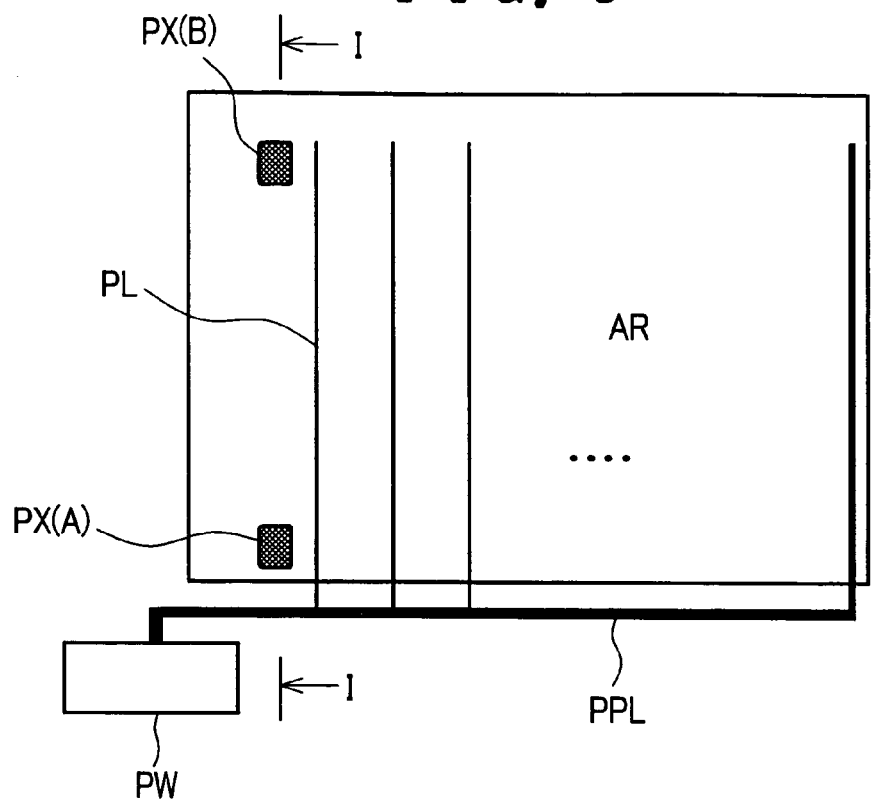
FIG. 5 is an explanatory view showing a drawback when the present invention is not applied to the display device.

FIG. 5 is an explanatory view showing a drawback when the present invention is not applied and corresponds to FIG. 3. The drawing is depicted such that the display part AR, the light emitting power source part PW and the power source signal lines PL which extend from the light emitting power source part PW to the display part AR are extracted.

Here, in the constitution shown in FIG. 5, a size (line width) of the power source common line PPL is set large so as to reduce a voltage drop in the power source common line PPL. The power source common line PPL is formed in a region outside the display part AR and has a spatial tolerance and hence, it is possible to allow the power source common line PPL to have the relatively large line width.

Incidentally, the power source signal lines PL are formed in the inside of the region of the display part AR and hence, to prevent the reduction of a so-called numerical aperture of the pixel, the power source signal lines PL are formed relatively narrowly (line width) whereby the voltage drop in the power source common signal line PL is not ignorable.

Further, in FIG. 5, among the respective pixels which are formed along the power source signal lines PL in the inside of the display part AR, the pixel PX (A) which is arranged closest to the light emitting power source part PW and the pixel PX (B) which is arranged remotest from the light emitting power source part PW are shown.

In this case, as the power source signal line PL in the inside of the display part AR becomes remoter from the light emitting power source part PL, the voltage drop is generated, wherein the voltage applied to an anode PP of the pixel B from the power source supply part exhibits the difference of approximately 0.3V, for example, with respect to the voltage applied to an anode PP of the pixel A from the power source supply part, and this difference of the applied voltage is observed with naked eyes as the difference of brightness.

Figure 6:
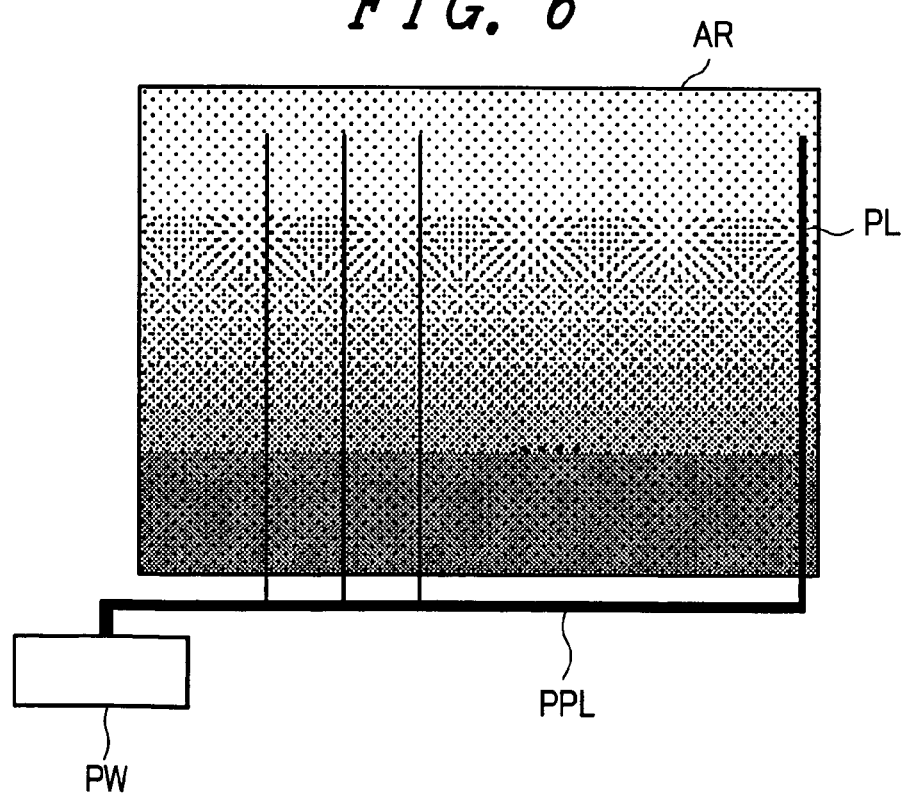
FIG. 6 is an explanatory view showing the non-uniformity of the brightness of a display part when the present invention is not applied to the display device.

Accordingly, when the display part AR is viewed as a whole, as indicated by the gray scale difference shown in FIG. 6 which is depicted corresponding to FIG. 5, a phenomenon that a lower portion of the display part AR exhibits the high brightness and the brightness is gradually lowered toward an upper portion of the display part AR is observed.

Figure 7:
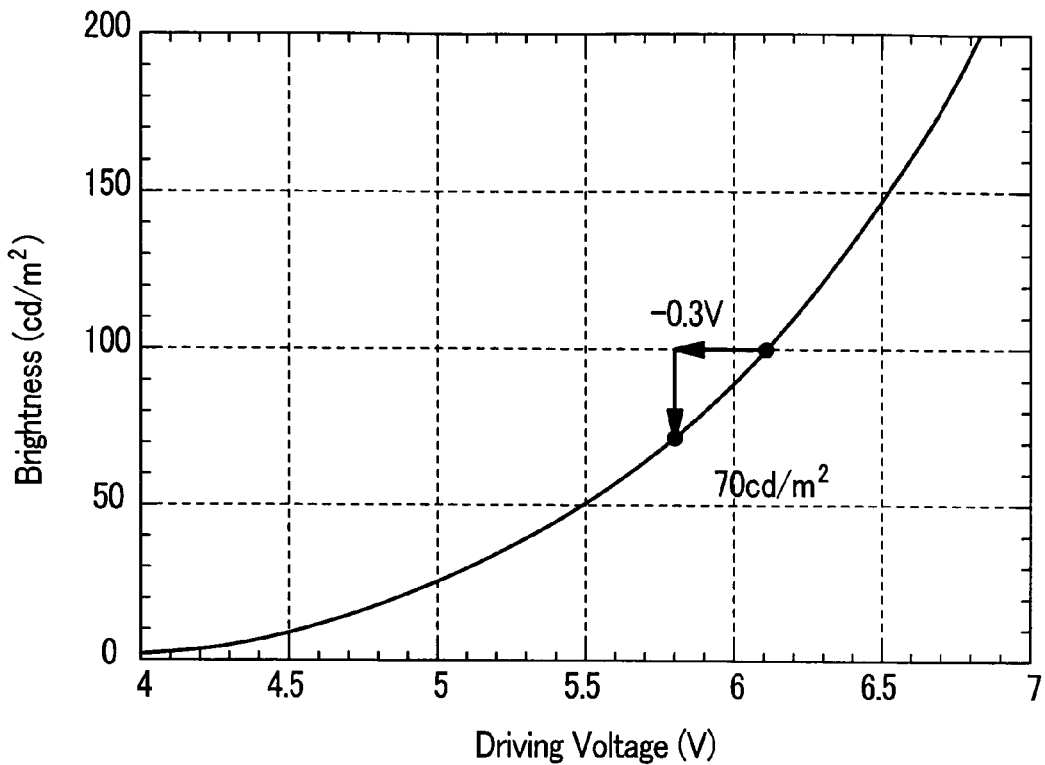
FIG. 7 is a graph showing the relationship between a driving voltage of a light emitting layer and the brightness.

FIG. 7 is a graph showing the relationship between the driving voltage applied to the pixel and the brightness, wherein the driving voltage (V) is taken on an axis of abscissas and the brightness ($cd/m^2$) is taken on an axis of ordinates. The graph shows that the brightness of the pixel is increased along with the increase of the driving voltage and, at the same time, shows that when the driving voltage applied between the anode PP and the cathode NP of the pixel is lowered by 0.3V, the brightness of the pixel is lowered to approximately 70 cd/m FIG. 1 is a cross-sectional view of one embodiment of an organic EL display device according to the present invention which improves the constitution of each pixel in view of such a drawback.

Figure 1:
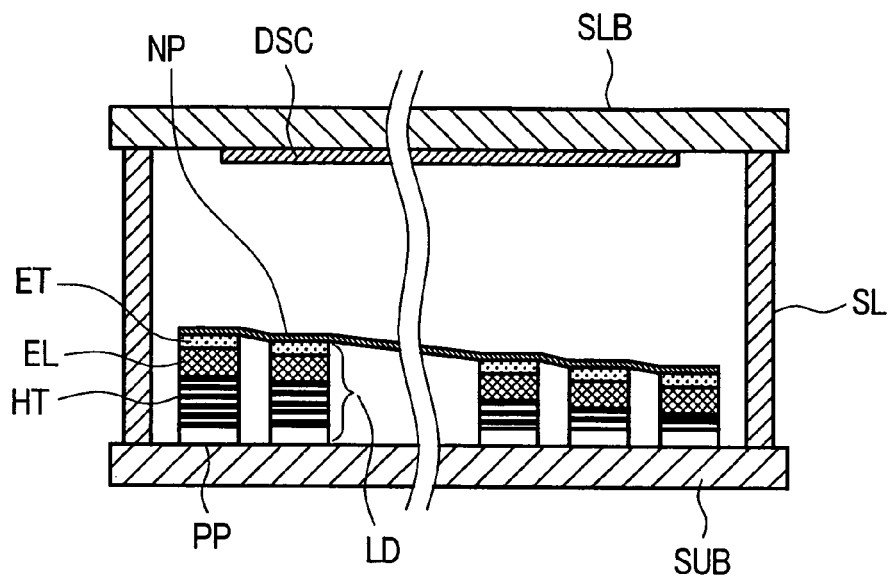
FIG. 1 is a cross-sectional view showing one embodiment of an essential part of a display device according to the present invention.

FIG. 1 is a view corresponding to a cross section taken along a line I-I in FIG. 5. To explain the constitution of the organic EL display device shown in FIG. 1 in a complementary manner, the light emitting element LD of each pixel is constituted of a sequentially stacked body formed of, for example, the anode PP made of a light-transmitting material such as ITO, a hole transport layer HT, an organic EL layer EL, an electron transport layer ET and the cathode NP which are stacked from a surface of a transparent substrate SUB.

Here, although not shown in the drawing, the above-mentioned power source signal line PL is formed in a state that the power source signal line PL extends in the direction that the respective light emitting elements LD are arranged in parallel in the drawing, and the anodes PP of the respective light emitting elements LD are connected to the above-mentioned power source signal line PL by way of the above-mentioned drive elements D-TFT.

Further, the cathode NP is formed in common with respect to the respective pixels and is formed covering the whole region of the display part AR which is formed of a mass of the pixels.

Here, the reason that the anodes PP are formed of the light-transmitting material is that the light from the light emitting layers EL can be led to the transparent substrate SUB side through the anodes PP.

Further, in the respective pixels, respective heights of the anode PP, the organic El layer EL, the electron transport layer ET and the cathode NP are set uniform. However, a height of the hole transport layer HT is gradually decreased as the pixel becomes remoter from the light emitting power source part PW in the extending direction of the power source signal line PL.

Due to such a constitution, the heights of the sequential stacked bodies each of which is constituted of the anode PP, the hole transport layer HT, the organic EL layer EL, the electron transport layer ET and the cathode NP in the respective pixels are gradually decreased in the extending direction that the power source signal line PL becomes remoter from the light emitting power source part PW.

Here, with respect to the pixels which are not shown in FIG. 1 and are arranged from a front to a back of a paper surface in FIG. 1 including any one of the respective pixels shown in FIG. 1, the heights of the hole transport layers HT are set substantially equal and hence, the heights of the sequential stacked bodies each of which consists of the anode PP, the hole transport layer HT, the organic EL layer EL, the electron transport layer ET and the cathode NP are also set substantially equal. This is because that the pixels are constituted on a premise that the line width of the power source common line PPL shown in FIG. 5 is formed relatively large and hence the voltage drop at the light emitting power source part PW side is relatively small.

Figure 8:
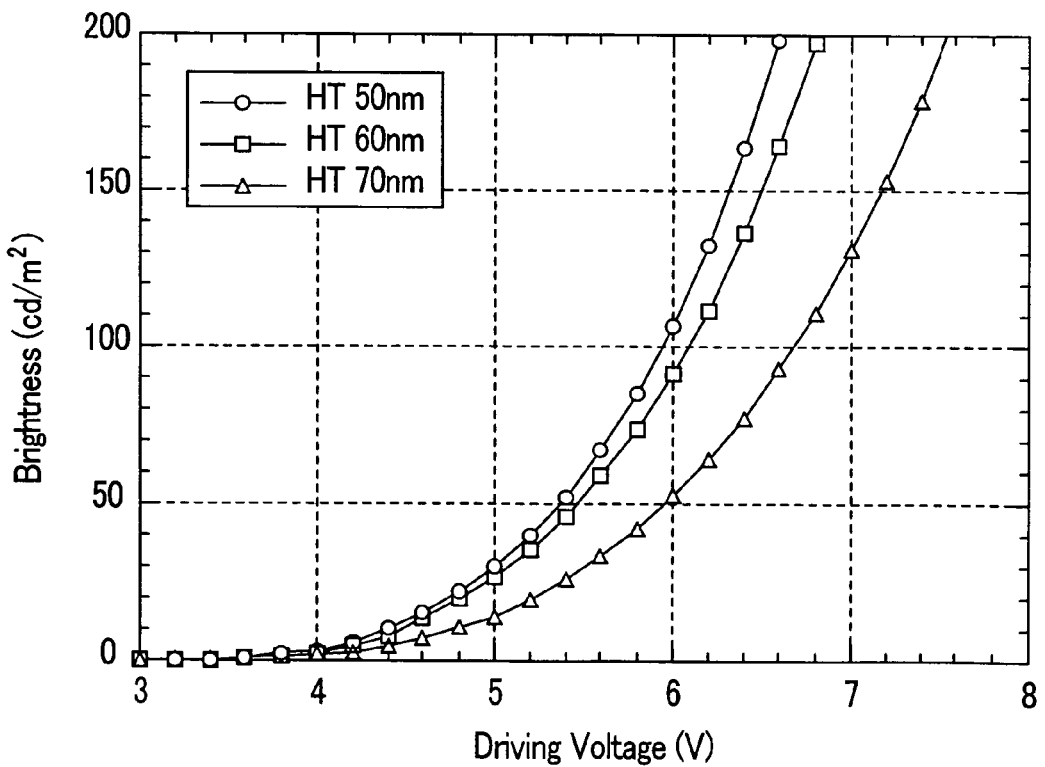
FIG. 8 is a graph which shows the relationship between the driving voltage of the light emitting layer and the brightness using the difference in thicknesses of hole transport layers.

In this manner, the reason that the height of the hole transport layer HT is decreased as the pixel becomes remoter from the light emitting power source part PW in the respective pixels which use the power source signal line PL in common is based on characteristics of the hole transport layer HT shown in FIG. 8.

FIG. 8 is a graph showing a relationship between the brightness of the pixel and the driving voltage thereof when the height of the hole transport layer HT is changed. In the graph, the driving voltage (V) is taken on an axis of abscissas and the brightness (cd/m$^2$) is taken on an axis of ordinates.

With respect to the respective characteristic curves shown in the drawing, the characteristic curve indicated by a circular mark in the drawing shows a case in which the height of the hole transport layer is set to 50 nm, the characteristic curve indicated by a square mark in the drawing shows a case in which the height of the hole transport layer is set to 60 nm, and the characteristic curve indicated by a triangular mark in the drawing shows a case in which the height of the hole transport layer is set to 70 nm. It is found out from the drawing that the brightness is increased with respect to the given driving voltage in the above-mentioned order. This fact, in other words, implies that the height of the hole transport layer may be decreased to obtain the given brightness at the low driving voltage.

Figure 9:
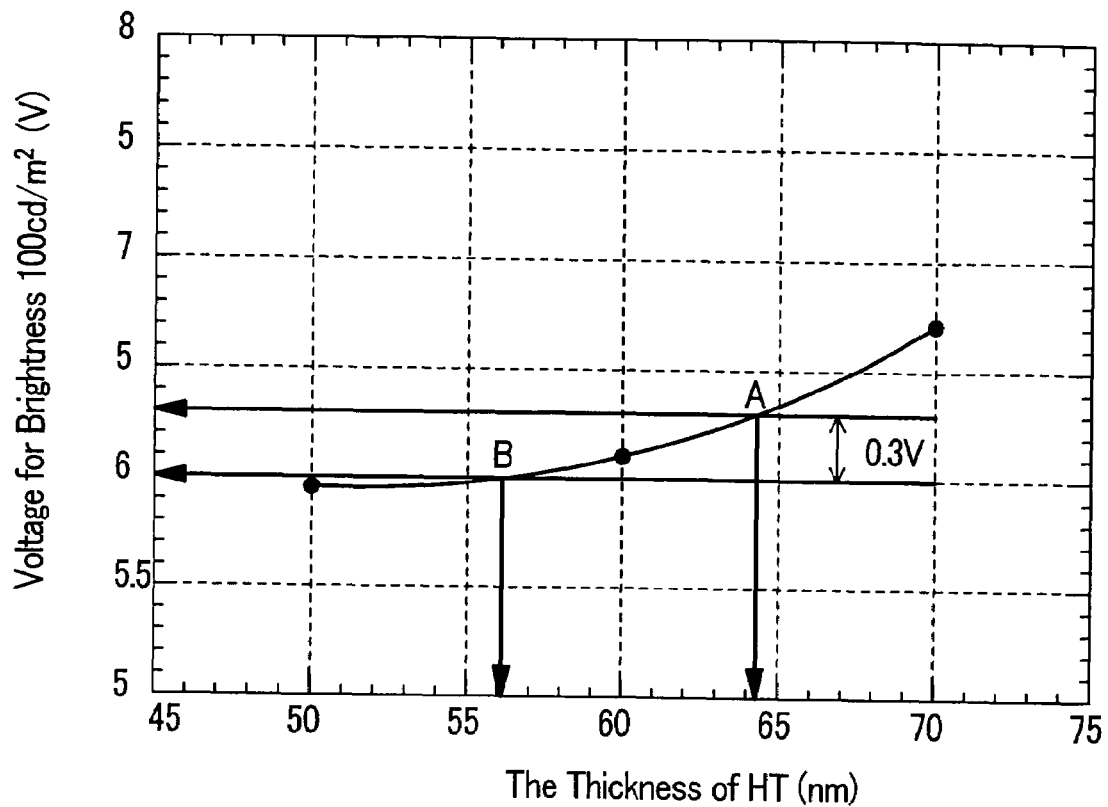
FIG. 9 is a graph showing the relationship between a voltage at the time of emitting light of 100 cd/m² and a film thickness of the hole transport layer using the change of the driving voltage.

Further, FIG. 9 is a graph showing the relationship between the height of the hole transport layer HT and a voltage at the time of emitting light of 100 cd/m$^2$. In the graph, a hole transport layer film thickness (nm) is taken on an axis of abscissas and the voltage (V) at the time of emitting light of 100 cd/m$^2$ is taken on an axis of ordinates.

Further, the graph shows that the film thickness of the hole transport layer of the pixel which is closest to the light emitting power source part PW is 64.5 nm at a portion A of the characteristic indicated in the graph, and the film thickness of the hole transport layer of the pixel which is remotest from the light emitting power source part PW is 56.0 nm at a portion B of the characteristic indicated in the graph.

From this graph, it is found out that even when the difference between the driving voltage applied to the pixel which is closest to the light emitting power source part PW and the driving voltage applied to the pixel which is remotest from the light emitting power source part PW is 0.3V, for example, it is possible to obtain the uniform brightness of 100 cd/m$^2$ in both driving voltages by setting the height of the hole transport layer of the former pixel to 64.5 nm, for example, and the height of the hole transport layer of the latter pixel to 56.0 nm, for example.

Figure 10:
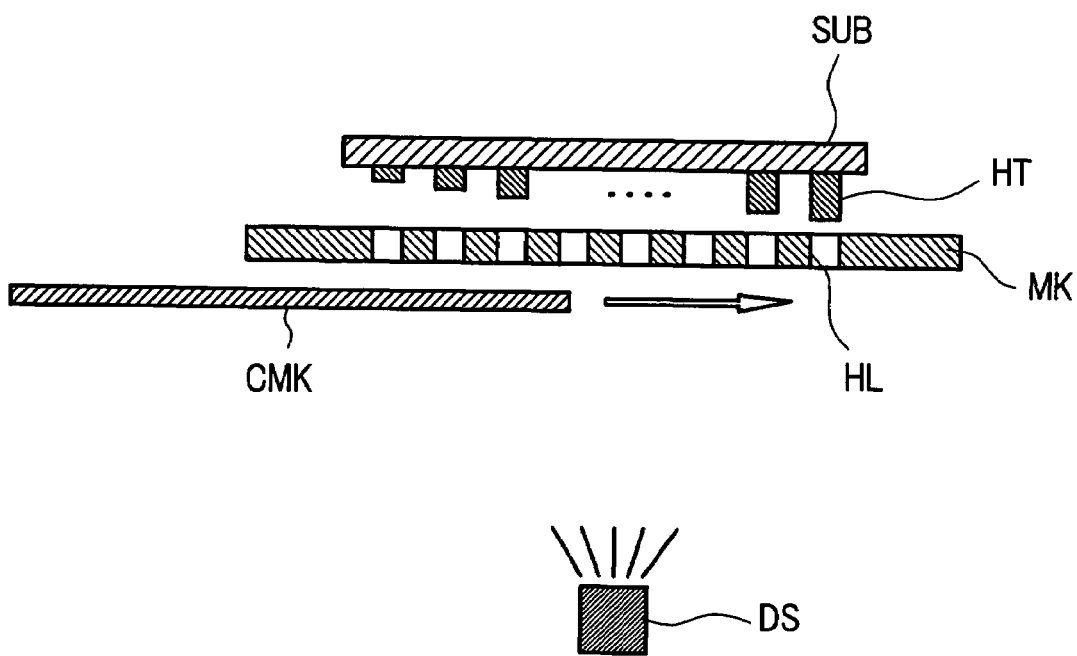
FIG. 10 is an explanatory view showing one embodiment of a manufacturing method of the display device according to the present invention.

FIG. 10 is a constitutional view showing one embodiment of a manufacturing method of the above-mentioned display device and shows the manufacturing method in which the heights of the hole transport layers HT in the respective pixels are changed along the extending direction of the power source signal line PL.

Here, in forming the hole transport layers HT on the surface of the transparent substrate SUB, the anodes PP or other material layers are already formed on the surface. In FIG. 10, however, these layers are omitted.

In forming the hole transport layers HT on the transparent substrate SUB, by interposing a mask MK between a point-source-type vapor deposition source DS and the transparent substrate SUB, for example, the hole transport layers HT are selectively formed on given regions for respective pixels on the surface of the transparent substrate SUB. The above-mentioned mask MK is fixedly arranged on the transparent substrate SUB, and a material of the hole transport layers from the vapor deposition source DS is applied to the transparent-substrate-SUB-side surface through apertures HL formed in the mask MK thus forming the hole transport layers HT.

Further, a film thickness adjusting mask (vapor deposition shielding plate) CMK is newly mounted between the above-mentioned mask MK and the vapor deposition source SD, for example, and the film thickness adjusting mask CMK is moved in one direction (an arrow-indicated direction in the drawing) during the above-mentioned vapor deposition operation.

The film thickness adjusting mask CMK is constituted of a plate-like member having no apertures per se and is moved along the extending direction of the power source signal line PL from the direction moving away from the light emitting power source part PW to the direction approaching to the light emitting power source part PW.

Due to such a constitution, with respect to the respective pixels formed along the power source signal line PL, the vapor deposition time of the hole transport layer HT is short at the side moving away from the light emitting power source part PW, while the vapor deposition time is elongated at a side close to the light emitting power source part PW. Accordingly, it is possible to allow the hole transport layer HT to have a large height at the side close to the light emitting power source part PW and to have a small height at a side remote from the power source part.

Since the method uses a point-source-type vapor deposition source as the vapor deposition source DS, the method is preferably used in a so-called "single-pattern work" in which one display device is manufactured from a sheet of mother glass. Here, the point-source-type vapor deposition source DS is a source which performs vapor deposition while being fixed with respect to the transparent substrate SUB.

Figure 11:
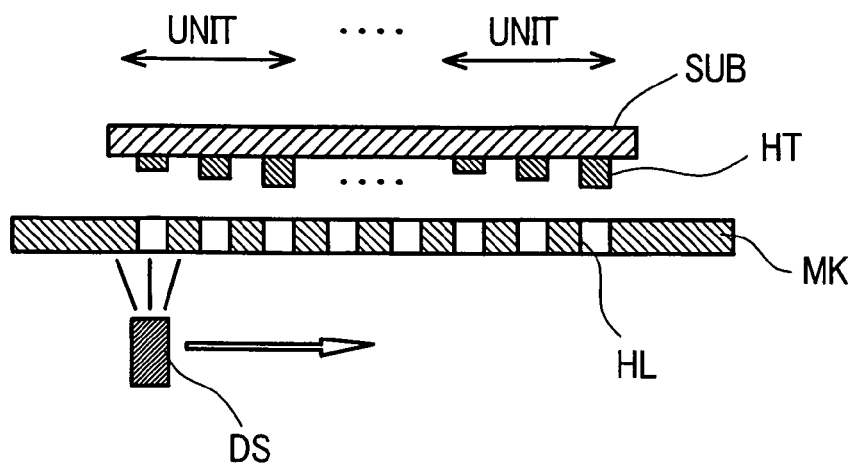
FIG. 11 is an explanatory view showing another embodiment of the manufacturing method of the display device according to the present invention.

FIG. 11 is a constitutional view showing another embodiment of the manufacturing method of the display device and shows the manufacturing method which is adopted when the respective pixels are formed in a state that the heights of the hole transport layers HT in the respective pixels are changed along the extending direction of the power source signal line PL.

A so-called linear-source-type vapor deposition source is used as the vapor deposition source DS and the vapor deposition source DL is configured to perform the vapor deposition by moving with respect to the transparent substrate SUB from one side to another side of the transparent substrate SUB (in the direction indicated by an arrow in the drawing).

Further, as one transparent substrate SUB, a large-sized substrate which can be separated into a plurality of transparent substrate by cutting performed later is used, wherein each one of respective separated transparent substrates (indicated by UNIT in the drawing) constitutes the substrate of the display device. This method is referred to as a so-called "multiple pattern work", wherein a plurality of products can be manufactured from a sheet of mother glass.

Between the transparent substrate SUB and the vapor deposition source DS, a mask MK which is arranged in a fixed manner with respect to the transparent substrate SUB is provided and the vapor deposition is performed through apertures HL formed in the mask MK.

As described above, the above-mentioned transparent substrate SUB is provided as a substrate which is used for the multiple pattern work and hence, the apertures HL formed in the mask MK have the similar patterns for respective transparent substrates UNIT which are separated later.

The above-mentioned vapor deposition source DS has the movement thereof set different for the respective transparent substrates UNIT which are separated from each other such that the initial speed is large and, thereafter, the speed is gradually decreased. At a portion where the speed is large, a coating amount of the organic material is small and hence, a thickness of the hole transport layer HT becomes small, while at a portion where the speed is small, the coating amount of the organic material becomes large and hence, a thickness of the hole transport layer HT is large.

Accordingly, it is not always necessary to ensure the large movement of the vapor deposition source DS initially and it is possible to obtain the similar advantageous effect even when the movement of the vapor deposition source DS is small initially and is increased gradually thereafter.

Figure 12:
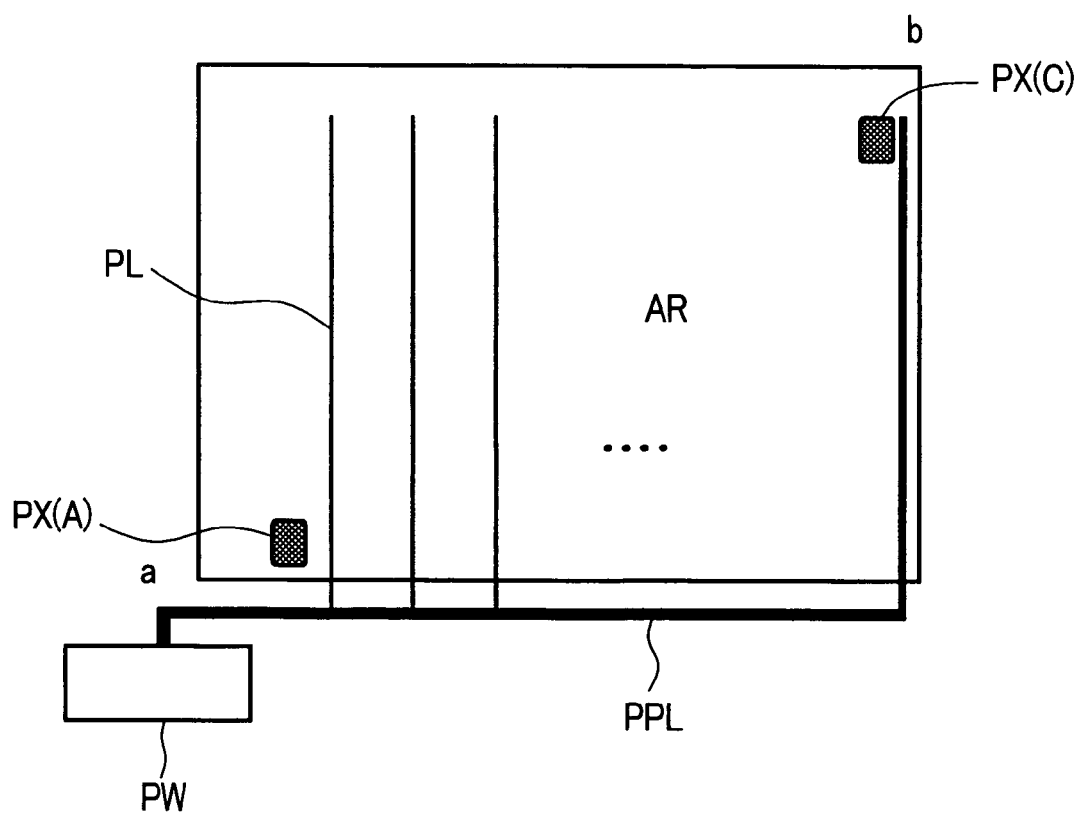
FIG. 12 is a plan view showing another embodiment of the display device according to the present invention.

FIG. 12 is a plan view showing another embodiment of the constitution of the display device according to the present invention and corresponds to FIG. 4.

The constitution which makes this embodiment different from the embodiment shown in FIG. 4 lies in that, first of all, the power source common line PPL is narrowed to an extent that the voltage drop is no more ignorable.

Further, the thicknesses of the light emitting layers of the respective pixels are gradually changed in an increasing manner from one corner "a" of the display part AR arranged close to the light emitting power source part PW to another corner "b" of the display part AR which faces one corner "a". Here, the pixel arranged in the vicinity of one corner "a" of the display part AR is indicated as the pixel PX (A) and the pixel arranged in the vicinity of one corner "b" of the display part AR is indicated as the pixel PX(C).

Figure 13:
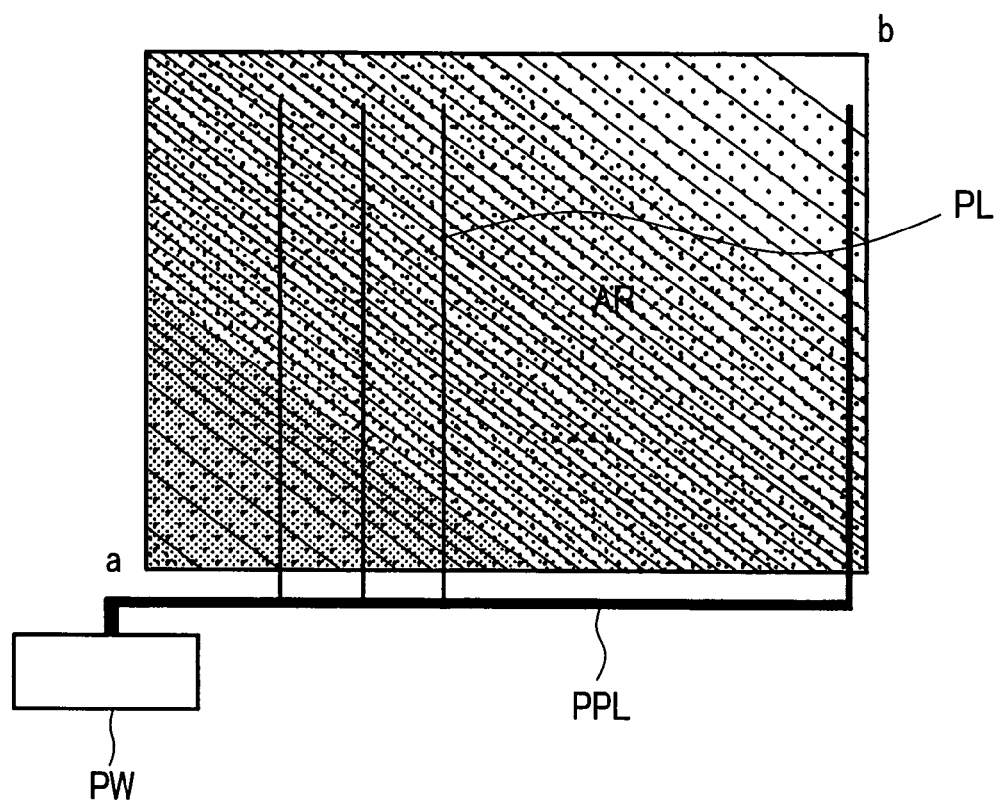
FIG. 13 is an explanatory view further showing the constitution in FIG. 12.

That is, as shown in FIG. 13 which corresponds to FIG. 12, the thicknesses of the hole transport layers HT of the respective pixels are indicated by gray scale distribution, wherein the pixel portion where the hole transport layer HT is large is depicted with a dark gray scale and the pixel portion where the thicknesses of the hole transport layer HT is small is depicted with a light (weak) gray scale. In the gray scale distribution shown in FIG. 13, portions which have the equal density correspond to the pixels where the thicknesses of the hole transport layers HT are equal, and these pixels are arranged on a line in the direction which intersects an imaginary line which connects the above-mentioned one corner "a" of the display part AR and another corner portion "b" which faces one corner "a".

Accordingly, the thicknesses of the hole transport layers HT of the respective pixels are made smaller along the direction that the respective power source signal lines PL become remoter from the above-mentioned power source common line PPL and, at the same time, the thicknesses of the hole transport layers HT of the respective pixels are made smaller along the direction that the respective power source signal lines PL become remoter from the above-mentioned light emitting power source part PW in the direction perpendicular to the direction.

This embodiment provides the countermeasure which takes not only the voltage drop attributed to the power source signal lines PL but also the voltage drop attributed to the power source common line PPL, wherein the embodiment can overcome the drawback that the power source from the light emitting power source part PW induces the voltage drop due to the power source common line PPL and hence, the power source supplied to the respective power source signal lines PL is relatively reduced as the power source becomes remoter from the light emitting power source part PW.

Here, in FIG. 13, although the light emitting power source part PW is arranged at one corner "a" of the display part AR, the position of the light emitting power source part PW is indicated to explicitly show the side on which the power source is supplied to the power source common line PPL. Accordingly, when the side on which the power source is supplied to the power source common line PPL is arranged at the above-mentioned one corner "a" side of the display part AR as shown in FIG. 13, in an actual operation, it is needless to say that the physical arrangement position of the above-mentioned light emitting power source part PW is not limited to the case shown in FIG. 13.

Figure 14:
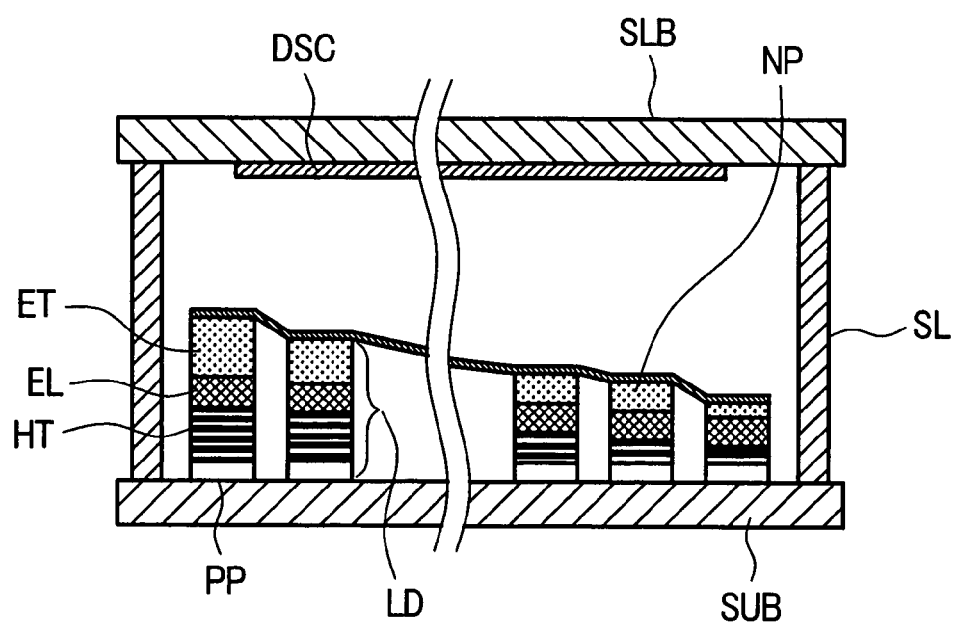
FIG. 14 is a cross-sectional view showing another embodiment of an essential part of the display device according to the present invention.

FIG. 14 is a cross-sectional view showing another embodiment of a display device according to the present invention and corresponds to FIG. 6.

The constitution which makes this embodiment different from the embodiment shown in FIG. 6 lies in that with respect to the light emitting elements LD each of which is stacked containing the electron transport layer ET and the hole transport layer HT, not only the heights of the hole transport layers HT but also the heights of the electron transport layers ET are changed so as to change the whole heights of the light emitting elements LD.

This is because that, also in this case, there exists a relationship that when the height of the electron transport layer ET is large, a relatively large voltage is necessary to allow the organic EL layer EL to emit light with a given brightness, while when the height of the electron transport layer ET is small, a small voltage is sufficient to allow the organic EL layer EL to emit light with the substantially equal brightness.

This embodiment is particularly advantageous when the voltage drop when the power source is supplied to the power source signal lines PL is relatively large.

Here, in this embodiment, while the heights of the hole transport layers HT are changed, the heights of the electron transport layers ET are also changed. However, it is needless to say that the embodiment adopts the constitution which changes only the heights of the electron transport layers ET.

Further, the light emitting element LD may be configured to include the organic EL layer EL which constitutes the light emitting source while excluding either one of the hole transport layer HT or the electron transport layer ET. In such a case, when the light emitting element LD includes the hole transport layer HT, the thickness of the hole transport layer HT is changed so as to obtain the substantially equal advantageous effect, while when the light transport element LD includes the electron transport layer ET, the thickness of the electron transport layer ET is changed so as to obtain the substantially equal advantageous effect.

Further, it is needless to say that the heights of the organic EL layers EL may be changed.

That is, as the stacked structure of the light emitting element LD, the sequential stacked body consisting of the hole transport layer HT, the organic EL layer EL and the electron transport layer ET, the sequential stacked body consisting of the organic EL layer EL and the electron transport layer ET, the sequential stacked body consisting of the hole transport layers HT and the organic EL layer EL or the like is considered.

Further, by changing the vertical arrangement of the anode PP and the cathode NP of the light emitting element LD, the sequential stacked body consisting of the electron transport layer ET, the organic EL layer EL and the hole transport layer HT, the sequential stacked body consisting of the organic EL layer EL and the hole transport layer HT, the sequential stacked body consisting of the electron transport layers ET and the organic EL layer EL or the like is also considered.

In this specification, any one of these layer structures is referred to as the light emitting layer and the present invention is established provided that when the thickness of the light emitting layer is smaller (larger) than the thicknesses of other light emitting layers, it is sufficient that at least one layer out of the hole transport layer HT, the organic EL layer EL and the electron transport layer ET has the thickness smaller (larger) than the thicknesses of other layers.

This relationship is adopted by embodiments described hereinafter in the same manner.

Figure 15:
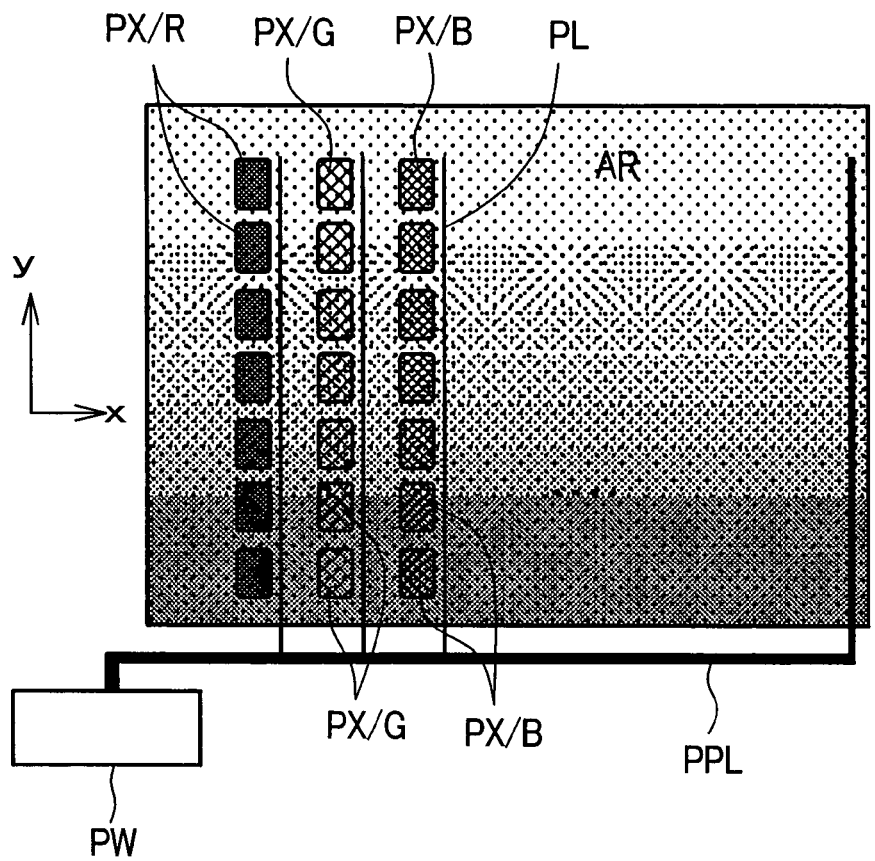
FIG. 15 is a plan view showing another embodiment of the display device according to the present invention.

FIG. 15 an explanatory view showing another embodiment of the display device of the present invention and shows a display device for color display.

The display device for color display is configured such that three pixels which are arranged in parallel to each other respectively include the light emitting layer which exhibits coloring of red (R), the light emitting layer which exhibits coloring of green (G) and the light emitting layer which exhibits coloring of blue (B).

In FIG. 15, the respective pixels of the first row which are arranged in parallel to each other in the x direction in the drawing are sequentially arranged in order of the red pixel PX/R, the green pixel PX/G and the blue pixel PX/B, the red pixel PX/R, . . . . The first three pixels constitute a unit pixel for color display and these unit pixels are sequentially arranged in the x direction.

In the second row and rows which follow the second row, the pixels are arranged in the above-mentioned manner. Accordingly, all of the respective pixels in the first column arranged in the y direction in parallel are formed of the red pixel PX/R, all of the respective pixels in the second column are formed of the green pixel PX/G, and all of the respective pixels in the third column are formed of the blue pixel PX/B.

Here, in FIG. 15, the respective pixels are indicated in place of the light emitting layers formed in the inside of the pixels for facilitating the explanation of the constitution. Accordingly, gate signal lines GL which are formed in the respective pixels in each row in common, thin film transistors TFT which are driven in response to a scanning signal from the gate signal line GL, video signal lines DL which supply a video signal through the thin film transistors TFT and the like are omitted from the drawing.

In FIG. 15, besides the above-mentioned light emitting layers, respective power source signal lines PL which supply the power source to the respective pixels, a power source common line PPL to which one-end sides of the respective power source signal lines PL are connected in common, and a light emitting power source part PW which supplies the power source to the power source common line PPL are indicated.

The above-mentioned power source signal lines PL are provided in common to the respective pixels which extend in the y direction and are arranged in the column direction in the drawing. Accordingly, all of the respective pixels connected to one power source signal line PL are formed of any one of the red pixel PX/R, the green pixel PX/G and the blue pixel PX/B.

Here, in this embodiment, for example, the power source common line PPL has a width thereof set larger than a width of the power source signal line PL. That is, the power source common line PPL is formed to have the resistance smaller than the resistance of the power source signal line PL.

Figures 16A, 16B, 16C:
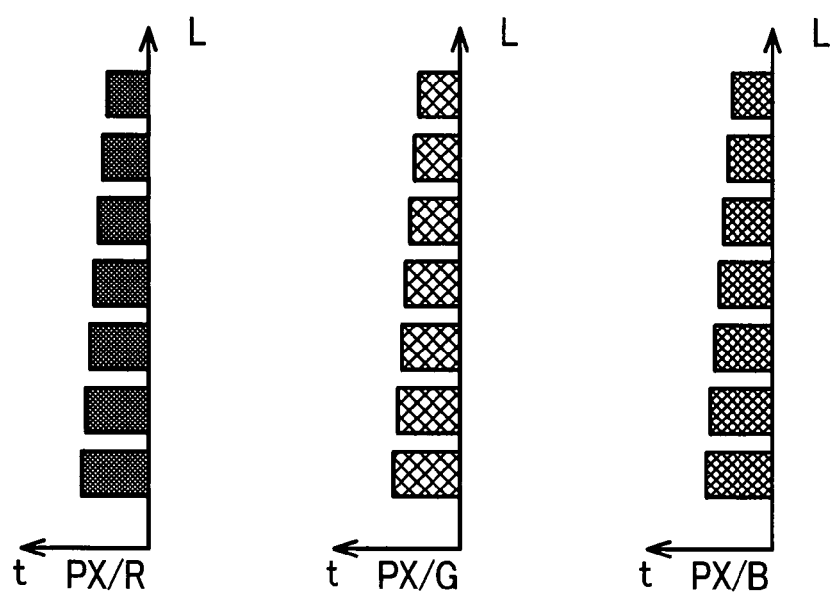
FIG. 16 is a graph showing height gradients along power source signal lines of light emitting layers of respective colors shown in FIG. 15.

Further, with respect to the respective pixels which form the red pixel PX/R which are arranged in the column direction and use the power source signal line PL in common, for example, the heights of the light emitting layers of the pixels are set such that, as shown in FIG. 16A, the height of the light emitting layer is large at the power source common line PPL side and is gradually decreased as the pixel becomes remoter from the power source common line PPL and, at the same time, a gradient of the change of height is set to a relatively large value.

Here, in FIG. 16A, the height of the light emitting layer is taken on an axis of abscissas t and a distance L away from the power source common line PPL is taken on an axis of ordinates. Further, the gradient of the change of height of the light emitting layer may be approximated as the difference between the height of the pixel closest to the power source common line PPL and the height of the light emitting layer of the pixel remotest from the power source common line PPL.

Further, with respect to the respective pixels which form the green pixel PX/G which are arranged in the column direction and use the power source signal line PL in common, the heights of the light emitting layers of the pixels are set such that, as shown in FIG. 16B, the height of the light emitting layer is large at the power source common line PPL side and is gradually decreased as the pixel becomes remoter from the power source common line PPL and, at the same time, a gradient of the change of height is set to a relatively small value.

Still further, with respect to the respective pixels which form the blue pixel PX/B which are arranged in the column direction and use the power source signal line PL in common, the heights of the light emitting layers of the pixels are set such that, as shown in FIG. 16C, the height of the light emitting layer is large at the power source common line PPL side and is gradually decreased as the pixel becomes remoter from the power source common line PPL and, at the same time, a gradient of the change of height is set to a relatively large value.

Here, the respective light emitting layers of all of the red pixel PX/R, the green pixel PX/G and the blue pixel PX/B closest to the power source common line PPL have the substantially equal height. This is because that a line width of the power source common line PPL is set large and hence, a voltage drop of the power source common line PPL at the time of supplying power source can be ignored.

Further, the reason that the gradients of the respective heights of the red pixels PX/R, the green pixels PX/G and the blue pixels PX/B which are arranged along the power source signal lines PL are made different from each other is that it is necessary to make the light emissions of these pixels correspond to a fact that a current efficiency of the red pixel PX/R is 3 cd/A, a current efficiency of the green pixel PX/G is 10 cd/A and a current efficiency of the blue pixel PX/B is 5 cd/A.

In view of the above, in the above-mentioned embodiment, the gradient of the green pixels PX/G arranged along the power source signal line PL is set to the smallest value compared with the gradient of pixels of other colors. However, it is needless to say that the gradients of heights of the light emitting layers may be made different from each other between the red pixels PX/R and the blue pixels PX/B. In this case, it is sufficient that the gradients of the heights of the light emitting layers of the red pixel PX/R is set larger compared to the gradient of the height of the emitting layers of the blue pixels PX/B.

That is, the gradients of the heights of the light emitting pixels may be decreased in order of the red pixels PX/R, the blue pixels PX/B and the green pixels PX/G.

Here, although the line width of the power source common line PPL is made large in the embodiment shown in FIG. 15, it is needless to say that, as shown in FIG. 12, the line width of the power source common line PPL may be made small.

In this case, the drawback that the voltage drop is generated in the power source common line PPL at the time of supplying power source can be eliminated by constructing the pixels such that, for example, the red pixels PX/R, the blue pixels PX/B and the green pixels PX/G maintain the relationships described in FIG. 16A, FIG. 16B and FIG. 16C, and the whole heights are lowered as the pixels are moved away from the light emitting power source part PW of the power source common line PPL.

Further, in the above-mentioned respective embodiments, in the respective pixels which use the power source signal line PL in common, the heights of the light emitting layers are gradually lowered as the pixels become remoter from the power source supply side of the power source signal line PL. However, it is needless to say that the respective pixels are divided into a plurality of groups in which the pixels are sequentially arranged in parallel, the heights of the light emitting layers of the pixels in the inside of each group are set equal, and the heights of the light emitting layers of the pixels of the respective groups are sequentially made small as the pixels become remoter from the power source supply side.

That is, the respective pixels which are formed along the power source signal line PL have the light emitting layers which differ in thickness from each other, and these light emitting layers which differ in thickness may be configured such that the light emitting layers which are remote from the side which supplies the power source to the power source signal line PL have the thicknesses smaller than the thicknesses of the light emitting layers close to the side which supplies the power source.

In this embodiment, the light emitting layers include the organic EL layer. However, it is needless to say that this embodiment is not limited to the use of such an organic EL layer and the light emitting layers may include other light emitting material layer.

Further, an anode and cathode of each light emitting element LD may be respectively formed of a light transmitting conductive layer made of ITO or the like. Still further, a transparent leveling film which is constituted of a protective film made of resin or the like, for example, may be formed on an outside of one electrode (an upper-layer-side electrode with respect to a substrate SUB) so as to cancel the film thickness difference, and a reflection film may be formed on an outside of the transparent leveling film.

In such a case, it is possible to obtain an advantageous effect that cavity lengths of the respective organic EL layers ER in the inside of the display part AR can be made uniform.

Here, in the above-mentioned embodiments, as the power source signal line PL, a power source supply signal line which has one end thereof connected to a power source supply-end-side of the light emitting power source part PW and supplies the power source to the respective light emitting layers LD is shown.

However, it is needless to say that the above-mentioned power source signal line PL has one end thereof connected to a ground side of the above-mentioned light emitting power source part PW thus constituting a portion of the cathode NP of each light emitting layer LD. In this case, as the anode PP of the light emitting layer LD, a light transmitting conductive film which is used in common by the respective pixels may be formed.

In this manner, in case that the above-mentioned power source signal line PL is constituted as the power source signal line which is connected to the cathode NP of each light emitting layer LD, based on the above-mentioned technical concept, the light emitting layer LD which is arranged remote from the power source side of the power source signal line PL has the height larger than the height of the light emitting layer LD arranged close to the power source side of the power source signal line.

However, even when the power source signal lines PL are used in such a manner or when the power source signal line PL is used as the power source supply signal line as described above, the direction that the current flows is focused and the heights of the respective light emitting elements LD may be changed from the higher side to the lower side along the direction that the current flows.

That is, at an upstream side of the flow of the current along the power source signal line, the thickness of the light emitting layer may be set larger than the thickness of the light emitting layer at a downstream side.

The above-mentioned respective embodiments may be used in a single form or in combination. This is because that advantageous effects of the embodiments of the present invention may be obtained independently or synergistically.

What is claimed is:

1. A display device including a plurality of pixels which are arranged in a matrix array and are respectively provided with light emitting layers, wherein among the respective pixels, a power source is supplied to the respective light emitting layers of the respective pixels which are arranged in parallel in one direction through a common power source signal line, wherein
the respective pixels allow the light emitting layers thereof to have different thicknesses from each other in a state that the thickness of the light emitting layer arranged at an upstream side of a flow of an electric current along the power source signal line is set larger than the thickness of the light emitting layer at a downstream side of the flow of the electric current along the power source signal line.

2. A display device according to claim 1, wherein the light emitting layers of the respective pixels which use the power source signal line in common have the thicknesses thereof decreased as the pixels come closer to the downstream side of the flow of the electric current along the power source signal line.

3. A display device according to claim 1, wherein the respective pixels which use the power source signal line in common are divided into a plurality of groups along the power source signal line, the thicknesses of the light emitting layers are made different from each other for every group, and the thicknesses of the light emitting layers are decreased as the pixels come closer to a downstream side of an electric current along the power source signal line.

4. A display device according to claim 1, wherein the light emitting layer is constituted as a stacked body formed of the light emitting layer and at least a hole transport layer, and the difference in thickness of the light emitting layers is brought about by the hole transport layer.

5. A display device including a plurality of pixels which are arranged in a matrix array and are respectively provided with light emitting layers, wherein in the respective pixels, the light emitting layers of the respective pixels which are arranged in parallel in one direction emit light of any one of red, green and blue and, at the same time, the light emitting layers of the respective pixels which are arranged close to the respective pixels in the direction which intersects one direction emit lights of remaining respective colors, and
a power source is supplied to the respective light emitting layers of the respective pixels which are arranged in parallel in one direction through a common power source signal line, wherein
the respective pixels along the power source signal line have the light emitting layers which differ in thickness from each other, and the thicknesses of the light emitting layers at an upstream side of a flow of an electric current along the power source signal line is set larger than thicknesses of the light emitting layers at a downstream side of the flow of the electric current along the power source signal line, and
a gradient of a change of the thickness of at least the green light emitting layer along the power source signal line is set smaller than corresponding gradients of the light emitting layers of other colors.

6. A display device including a plurality of pixels which are arranged in a matrix array and are respectively provided with light emitting layers, wherein in the respective pixels, the light emitting layers of the respective pixels which are arranged in parallel in one direction emit light of any one of red, green and blue and, at the same time, the light emitting layers of the respective pixels which are arranged close to the respective pixels in the direction which intersects one direction emit lights of remaining respective colors, and a power source is supplied to the respective light emitting layers of the respective pixels which are arranged in parallel in one direction through a common power source signal line, wherein the respective pixels along the power source signal line have the light emitting layers which differ in thickness from each other, and the thicknesses of the light emitting layers at an upstream side of a flow of an electric current along the power source signal line is set larger than thicknesses of the light emitting layers at a downstream side of the flow of the electric current along the power source signal line, and a gradient of a change of the thickness of the at least red light emitting layer along the power source signal line is set larger corresponding gradients of the light emitting layers of other colors.

7. A display device according to claim 5, wherein the light emitting layers of the respective pixels which use the power source signal line in common have the thicknesses thereof decreased as the pixels come closer to the downstream side of the flow of the electric current along the power source signal line.

8. A display device according to claim 5, wherein the respective pixels which use the power source signal line in common are divided into a plurality of groups along the power source signal lines, the thicknesses of the light emitting layers are made different from each other for every group, and the thicknesses of the light emitting layers are decreased as the pixels come closer to the downstream side of the electric current along the power source signal line.

9. A display device according to claim 5, wherein the light emitting layer is constituted as a stacked body formed of the light emitting layer and at least a hole transport layer, and the difference in thickness of the light emitting layers is brought about by the hole transport layer.

10. A display device according to claim 1, wherein the display device includes a power source common line to which one ends of the respective power source signal lines are connected in common outside a display part which is formed of a mass of the respective pixels, and the power sources are supplied from one end of the power source common line, and the thicknesses of the light emitting layers of the respective pixels are changed in the direction from one corner of the display part arranged close to a power source side of the power source common line to another corner of the display part which faces one corner in an opposed manner.

11. A display device according to claim 6, wherein the light emitting layers of the respective pixels which use the power source signal line in the common have the thicknesses thereof decreased as the pixels come closer to the downstream side of flow of the electric current along the power source signal line.

12. A display device according to claim 6, wherein the respective pixels which use the power source signal line in common are divided into a plurality of groups along the power source signal lines, the thicknesses of the light emitting layers are made different from each other for every group, and the thicknesses of the light emitting layers are decreased as the pixels come closer to the downstream side of the electric current along the power source signal line.

13. A display device according to claim 6, wherein the light emitting layer is constituted as a stacked body formed of the light emitting layer and at least a hole transport layer, and the difference in thickness of the light emitting layers is brought about by the hole transport layer.

14. A display device according to claim 5, wherein the display device includes a power source common line to which one ends of the respective power source signal lines are connected in common outside a display part which is formed of a mass of the respective pixels, and the power sources are supplied from one end of the power source common line, and the thicknesses of the light emitting layers of the respective pixels are changed in the direction from one corner of the display part arranged close to a power source side of the power source common line to another corner of the display part which faces one corner in an opposed manner.

15. A display device according to claim 6, wherein the display device includes a power source common line to which one ends of the respective power source signal lines are connected in common outside a display part which is formed of a mass of the respective pixels, and the power sources are supplied from one end of the power source common line, and the thicknesses of the light emitting layers of the respective pixels are changed in the direction from one corner of the display part arranged close to a power source side of the power source common line to another corner of the display part which faces one corner in an opposed manner.

* * * * *